(12) United States Patent
Weiss et al.

(10) Patent No.: US 6,807,402 B2
(45) Date of Patent: Oct. 19, 2004

(54) DEVICE FOR GENERATING RF SIGNALS AT MULTIPLE FREQUENCIES

(75) Inventors: Michel Weiss, Gries (FR); Jean-Max Tyburn, Wissembourg (FR); Christian Brevard, Wissembourg (FR); Laurent Martinache, Marienthal (FR)

(73) Assignee: Bruker Biospin SA, Wissembourg (FR)

( * ) Notice: Subject to any disclaimer, the term of this patent is extended or adjusted under 35 U.S.C. 154(b) by 594 days.

(21) Appl. No.: 09/864,239

(22) Filed: May 25, 2001

(65) Prior Publication Data

US 2001/0049269 A1 Dec. 6, 2001

(30) Foreign Application Priority Data

May 25, 2000 (FR) .............................. 00 06699

(51) Int. Cl.[7] .............................. H04B 1/02; H04B 7/14
(52) U.S. Cl. ..................... 455/102; 455/103; 455/17; 455/561; 455/523; 455/287
(58) Field of Search ................................ 455/102, 118, 455/103, 7, 14, 17, 561, 523, 59, 290, 291, 292, 280, 281, 282, 287, 286; 375/211, 295

(56) References Cited

U.S. PATENT DOCUMENTS

| | | | | |
|---|---|---|---|---|
| 4,093,919 A | * | 6/1978 | Watanabe | 455/142 |
| 5,541,757 A | * | 7/1996 | Fuse et al. | 398/72 |
| 5,590,156 A | * | 12/1996 | Carney | 375/316 |
| 6,032,020 A | * | 2/2000 | Cook et al. | 455/7 |

FOREIGN PATENT DOCUMENTS

WO  WO 94/24772  10/1994

* cited by examiner

*Primary Examiner*—Duc M. Nguyen
(74) *Attorney, Agent, or Firm*—Young & Thompson

(57) ABSTRACT

A device for generating a radio frequency electrical signals, delivering at least two separate signals having different frequencies, in the form of signals delivered by different primary sources and amplified with a predetermined gain. The device comprises a combining circuit (3), combining the signals delivered by the primary sources (2), a single channel power amplifier (4) and a multi-channel selection and routing unit (5) with a parallel structure. Each channel delivers at the output an amplified signal (S) at a frequency (F) characteristic of one of the primary sources (2) and comprises a filter circuit (6) adjusted to be passing for one of the different characteristic frequencies (F) of the different primary sources (2), an impedance adaptation circuit (7) and a rejection circuit (8) for frequencies other than the passing frequency of the filter circuit (6) of the channel in question.

13 Claims, 3 Drawing Sheets

DEVICE FOR GENERATING RF SIGNALS AT MULTIPLE FREQUENCIES

The present invention relates to supplying radio frequency (RF) signals of medium or high power, at different frequencies, particularly in the field of scientific instrumentation using nuclear magnetic resonance (NMR), and has for its object a device for generating RF signals at multiple frequencies.

At present, in most cases of supplying RF signals at different frequencies and with a certain power level, as many couples (source/amplifier) are used as there are signals of different frequencies to be delivered, the source and the amplifier of each couple being designed and adapted to the corresponding frequency band.

This results in a complex structure, each amplifier requiring a particular supply, and very rigid in terms of characteristics and parameters.

Different solutions have been proposed to seek to overcome these drawbacks, by reducing the number of amplifiers.

However, these solutions do not give satisfaction, either because the signals produced do not have the power, or the qualities and/or the desired purity of frequency, or because the construction of the obtained embodiment was even more complex or at least as complex, particularly as to supply, as the conventional solution because of the use of an equivalent number of components or of active circuits.

The problem faced by the present invention consists accordingly in providing a structure of a generator device of the mentioned type, delivering signals with characteristics equivalent to those of the conventional solution described above, and comprising only one wideband amplifier circuit and without another additional active circuit except modulated signal sources.

To this end, the present invention has for its object a device for generating radio frequency electric signals, delivering at least two separate signals having different frequencies, in the form of signals delivered by different primary sources and amplified for the predetermined gain, characterized in that it comprises, in addition to said primary sources, on the one hand, a combining circuit, combining together, without intermodulation, the signals delivered by the primary sources, on the other hand, a signal channel wideband power amplifier having the baseband adapted to the different frequencies of the signals present in the combined signal from the combining circuit, and, finally, by a multi-channel selection and routing unit with a parallel structure, of which each channel delivers at the output an amplified signal at a frequency characteristic of one of the primary sources and comprises a filter circuit adjusted to be passing for one of the different frequencies characteristic of the different primary sources, and piece adaptation circuit and a rejection circuit for other frequencies than the passing frequency of the filter circuit of the channel in question.

A basic principle of the invention accordingly consists in combining, without mixing them, the elementary signals from different sources, passing them along a single channel toward a single amplification circuit, then selectively extracting from the amplified combined signal the different elemental signals and delivering, at the level of separate outlets, amplified elementary signals.

The invention also relates to a device for analyzing with nuclear magnetic resonance with several probes or measuring heads, particularly a spectrometer, characterized in that the measuring heads or probes are supplied by a generating device as mentioned above.

The present invention will be better understood from the following description, which relates to a preferred embodiment, given by way of non-limiting example, and explained with reference to the accompanying schematic drawings, in which.

Figure 1:
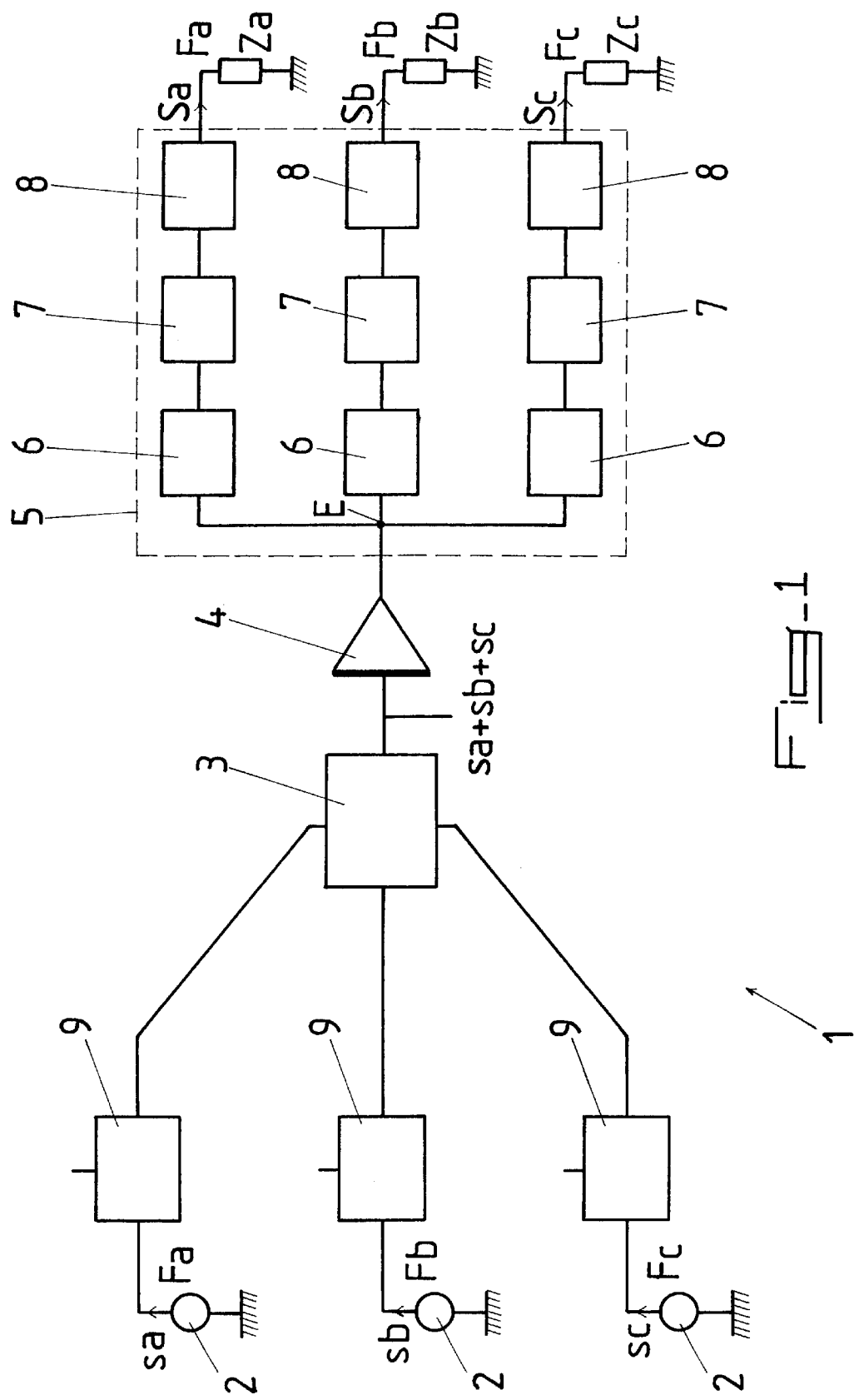
FIG. 1 is a diagram showing a generator device according to the invention delivering three amplified signals with three different frequencies.

As shown particularly in FIG. 1 of the accompanying drawings, the generating device 1 comprises essentially, in addition to the primary sources 2 of radio frequency signals sa, sb, sc, on the one hand, a combining circuit 3, combining without intermodulation, the signals s delivered by the primary sources 2, on the other hand by a single channel wideband power amplifier 4 having a passband adapted to the different frequencies F of the signals present in the combined signal from the combining circuit 3 and, finally, by a multi-channel selection and routing unit 5 of parallel structure, of which each channel delivers at the output an amplified signal S at a frequency F characteristic of one of the primary sources 2 and comprises a filter circuit 6 adjusted to be passing for one of the different characteristic frequencies F of the different primary sources 2, an impedance adaptation circuit 7 and a rejection circuit 8 for frequencies other than the passing frequency of the filter circuit 6 of the channel in question.

As a preferable modification of a practical embodiment, involving a particular simplification of the difficulties connected with multiple supplies, whilst avoiding the problems of insufficient discrimination arising from a too great reconciliation of the different frequencies of the signals to be amplified, the selection and routing unit 5 comprises at least three parallel channels, preferably between three and five channels, each channel delivering at the output an amplified signal S whose frequency F corresponds to that of a specific primary source 2.

Figure 2:
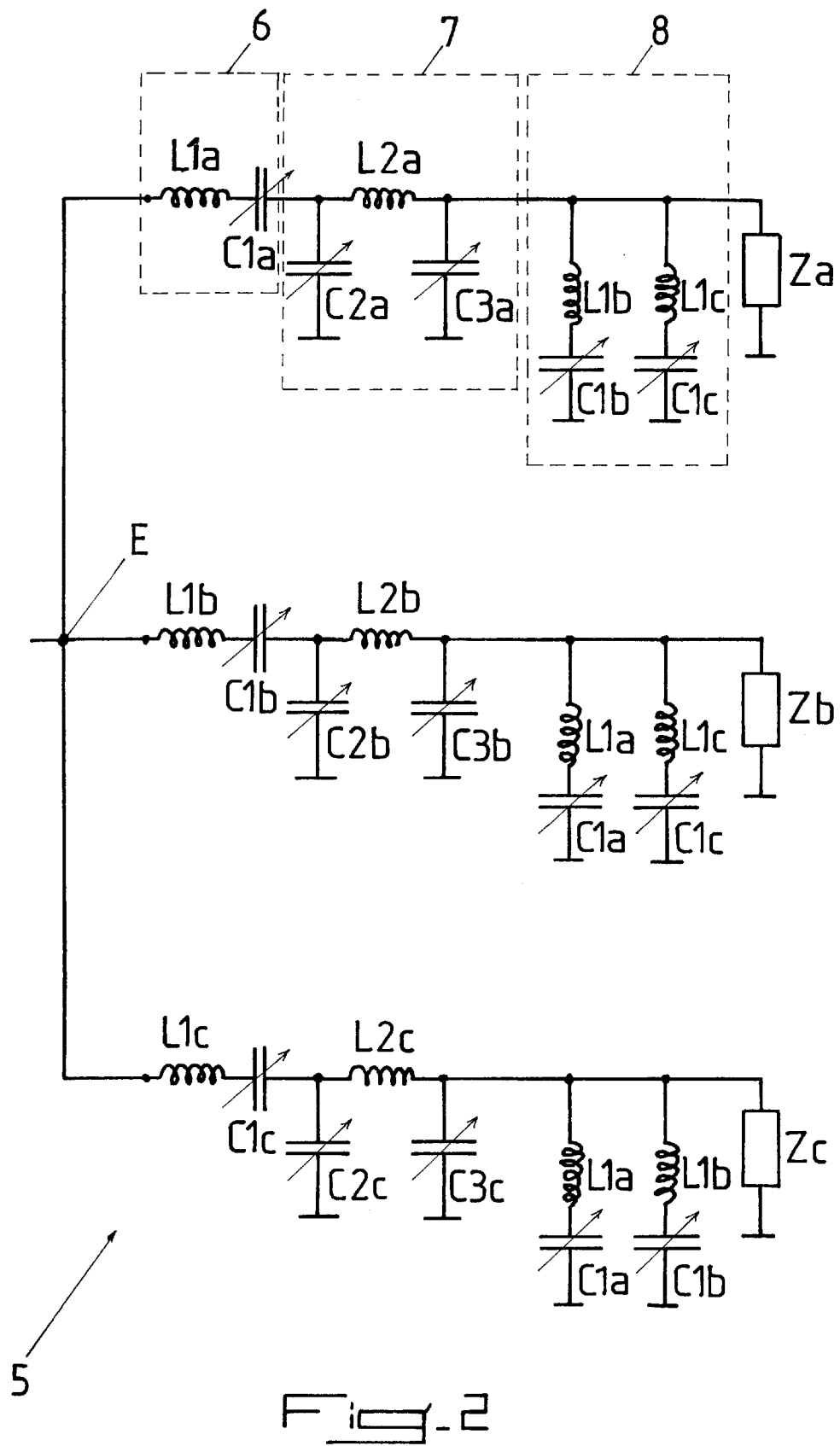
FIG. 2 is a circuit diagram of the selection and routing unit forming a part of the device shown in FIG. 1.

According to a preferred embodiment, particularly in terms of cost, shown in FIG. 2 of the accompanying drawings, each filter circuit 6 consists of a series L-C circuit, whose variable capacitance C1 is adjusted to render said filter circuit resonant at the output frequency F of the channel in question, said adaptation circuit consisting in a C-L-C circuit in pi, whose variable capacitances C1 and C2 are adjusted to carry out an adaptation of the channel in question at the load Z supplied by this latter and each rejection circuit 8 consists in several series L-C circuits mounted in parallel, of which each is adjusted to be resonant at one of the different output frequencies F of the device 1, other than that of the channel in question of the unit 5.

The rejection circuits 8 ensure, by complementing the filter circuits 6, an increase of the interfrequency discrimination or rejection by means of parallel narrow channel, channel-cutting filters, adjusted to the frequencies to be rejected.

The simplicity of construction and adjustment will be noticed that is available with this arrangement, the rejection circuit 8 of a channel being formed of series L-C circuits identical to the filter circuits 6 of the other channels of the unit 5.

As to the interpretation of FIG. 2, corresponding to an embodiment of the invention adapted to supply three amplified signals Sa, Sb and Sc, it will be noted that each channel or branch of the unit 5 comprises a filter circuit 7 formed by an inductance L1 and by a capacitance C1, an adaptation circuit 7 formed by an inductance L2 and two capacitances C2 and C3 and a rejection circuit 8 whose two channels or parallel branches each comprise an inductance L1 and a capacitance C1 corresponding to those of the filter circuits 6 of the other channels of the unit 5.

The indices a, b and c indicate the assignment and the adaptation of the three channels of the unit 5 to the three frequencies fa, fb and fc of the primary signals sa, sb and sc and of the amplified signals Sa, Sb and Sc, as well as the three loads Za, Zb and Zc.

As a modification of the embodiment described above, it can be provided that each series circuit L-C of the filter circuits 6 and of the rejection circuits 8 be replaced by a quarter wave coaxial line having a same frequency adjustment.

The choice of the components and their adjustments necessary for the practical embodiment of the generator device 1 are within the scope of those skilled in the art, when the latter has indications of the frequencies and qualities of the signals to be supplied (for example: Fa=40 MHz, Fb=100 MHz and Fc=400 MHz) as well as the values of the loads Z, and accordingly will not require any supplemental development work.

According to a further characteristic of the invention, each primary source 2 can consist of carrier generator whose output signal s of frequency F is modulated, for example by a pulsed signal, at the level of a corresponding modulation circuit 9, before its transmission toward the combining circuit 3.

According to a particularly advantageous application of the device according to the invention, the different signals S delivered at the output are applied to loads Z consisting in measuring heads of an NMR spectrometer.

So as to reduce the transmission of parasitic and disturbing signals between the amplifier 4 and the different outputs of the unit 5, it may be advantageous to provide, according to a modified embodiment of the invention, that the unit 5 for selection and mounting comprises means 10, 11 for insulation of its common input E relative to the outputs of its different channels.

Insulation means consisting preferably of diodes, particularly of the PIN type, a first diode 10 being mounted in series at the input of each channel (downstream of the common input point E and upstream of the respective filter circuits), and a second diode 11 being mounted in series at the output of each channel (in the unit 5 and downstream of the respective rejection circuits 8). Preferably, the distance between the pairs of diodes 10 and 11 of each channel will be fixed at ¼, for the frequency F in question.

Figure 3:
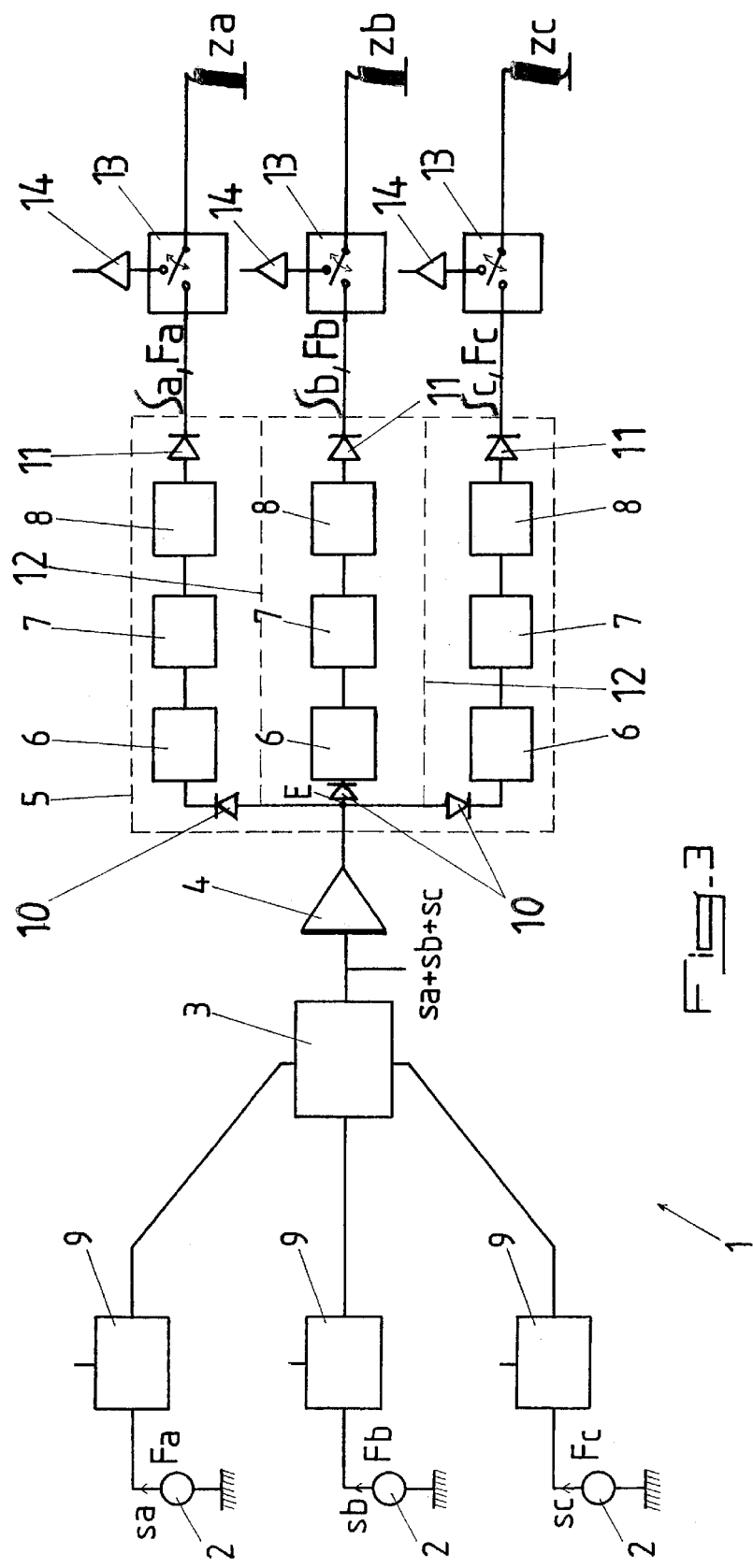
FIG. 3 is a fragmentary diagram similar to that of FIG. 1, of a device for analyzing NMR, comprising a generator device according to a modified embodiment of the invention.

According to a supplemental characteristic of the invention, also shown in FIG. 3 of the accompanying drawings, the unit 5 can moreover comprise supplemental electromagnetic insulation means 12 between the channels, for example in the form of separating or compartmenting walls, the unit 5 being itself mounted in an electromagnetic insulating envelope or casing (forming at least partially a Faraday cage), shown in broken lines in FIGS. 1 and 3.

The present invention also has for its object an analyzing device, particularly an NMR spectrometer, characterized in that the measuring heads or probes are supplied by a generator device 1 as described above.

FIG. 3 shows schematically the emission/reception system of such a spectrometric apparatus, the loads Za, Zb and Zc corresponding to the heads or probes associated with the specimen or specimens to be analyzed.

It is essentially comprised by:

a generator device as described above supplying RF power adapted to polarize the specimen or specimens to be analyzed;

a system 13 for emission/reception switching by channel, permitting switching this RF power toward the corresponding specimen in emission mode or to connect the specimen to a receiver in reception mode;

a receiver 14 with a low noise factor adapted to preamplify the NMR signal before processing in the processing chain of the spectrometer signal.

The insulation means 10 and 11 permit insulating substantially (100 dB) the receiver from the transmission in the reception mode. This does not significantly improve the performance of an NMR spectrometer in the "classical" configuration: an amplifier, a switching system and a receiver, but permits on the other hand new experiments in which several channels are adapted to be used at the same time, as the generator device according to the present invention permits.

This technology opens the doors to new configurations of spectrometers in which an amplifier could control several switching systems and several receivers. It is also possible to use perfectly linear amplifiers 4 that are not blanked in the reception mode.

The basic NMR experiment consists in applying to the specimen an RF pulse of controlled duration, power and phase, eliminating the amplifying signal 4 (or cutting its HF supply so as to render it less noisy) and to switch the system into the receiving mode so as to record the signal preamplified by the receiver. During this critical reception phase, any parasitic signal which could be emitted by the amplifier 4 will in the case of a conventional insulation easily be of the same order of magnitude, or even substantially greater, than the NMR signal of very low intensity. The principle of insulation reinforced according to the invention renders possible the saturation of the receiver by parasitic signals and therefore permits their elimination by conventional signal processing.

Finally, the present invention also relates to a process for the production of radio frequency electrical signals having different frequencies, with a single generating device 1, said signals being modulated or not, characterized in that said process consists in supplying several signals s having different frequencies F by means of several primary sources 2, in carrying out, as the case may be, a modulation of these different signals, in combining, without intermodulation, said signals s, if desired combined or mixed, by means of a combining circuit 3, in amplifying the combined signal by means of a wideband power amplifier 4, and if desired with variable gain, and, finally, applying the amplified combined signal to the common input E of a multi-channel selection and routing unit 5 with parallel structure, of which each channel comprises a filter circuit 6 adjusted to be passing for one of the different characteristic frequencies F of the primary sources 2, an impedance adaptation circuit 7 and a rejection circuit 8 for frequencies other than the passing frequency of the filter circuit 6 of the channel in question, and, finally, delivering at the level of each output of each of the different channels of said unit 5, an amplified signal S having a frequency F characteristic of one of the primary sources 2.

The different characteristics and modifications of embodiment of the circuits constituting the generating device 1, as described above, can also be applied in the scope of the present process.

Of course, the invention is not limited to the embodiment described and shown in the accompanying drawings. Modifications remain possible, particularly as to the construction of the various elements or by substitution of technical equivalents, particularly the ¼ lines produced with coaxial cables, without thereby departing from the scope of protection of the invention.

What is claimed is:

1. A generator device for generating radio frequency electric signals, delivering at least two separate signals having different frequencies in the form of signals delivered by different primary sources and amplified with a predetermined gain, characterized in that it comprises, in addition to said primary sources (2), on the one hand, a combining circuit (3), combining, without intermodulation, the signal or signals delivered by the primary sources (2), on the other hand, by a single channel wideband power amplifier (4) having a pass band adapted to the different frequencies (F) of the signals present in the combined signal from the combining circuit (3) and, finally, by a multi-channel selection and routing unit (5) with parallel structure, of which each channel delivers at the output an amplified signal (S) at a frequency (F) characteristic of the one of the primary sources (2) and comprises a filter circuit (6) adjusted to be passing for one of the different characteristic frequencies (F) of the different primary sources (2), an impedance adaptation circuit (7) and a rejection circuit (8) for frequencies other than the passing frequency of the filter circuit (6) of the selected channel.

2. The generator device according to claim 1, characterized in that the selection and routing unit (5) comprises at least three parallel channels, preferably between three and five channels, each channel delivering at the output an amplified signal (S) whose frequency (F) corresponds to that of a specific primary source (2).

3. The generator device according to claim 1, characterized in that each filter circuit (6) consists of a series L-C circuit, whose variable capacitance (C1) is adjusted to render said filter circuit (6) resonant at the output frequency (F) of the selected channel.

4. The generator device according to claim 3, characterized in that each series L-C circuit of the filter circuits (6) and of the rejection circuits (8) is replaced by a quarter wave coaxial line having the same frequency adjustment.

5. The generator device according to claim 1, characterized in that each adaptation circuit consists of a C-L-C circuit in pi, whose variable capacitances (C1 and C2) are adjusted to provide an adaptation of the selected channel to the load (Z) supplied by this latter.

6. The generator device according to claim 1, characterized in that each rejection circuit (8) consists of several series L-C circuits mounted in parallel, of which each is adjusted to be resonant at one of the different output frequencies (F) of the device (1), other than that of the selected channel of the unit (5).

7. The generator device according to claim 1, characterized in that each primary source (2) consists of a carrier generator whose output signal (s) of frequency (F) is modulated, for example by a pulse signal, at the level of a corresponding modulation circuit (9), before its transmission to the combining circuit (3).

8. The generator device according to claim 1, characterized in that the different signals (s) delivered at the output are applied to loads (Z) consisting in measuring heads of an NMR spectrometer.

9. The generator device according to claim 1, characterized in that the selection and mounting unit (5) comprises insulation means (10, 11) of its common input (E) relative to the outputs of its different channels.

10. The generator device according to claim 9, characterized in that the insulation means consist preferably of diodes, a first diode (10) being mounted in series at the input of each channel and a second diode (11) being mounted in series at the output of each channel.

11. The generator device according to claim 9, characterized in that the unit (5) can moreover comprise supplemental electromagnetic insulation means (12) between the channels, for example in the form of separation or compartmenting walls, the unit (5) being itself mounted in an electromagnetic insulation envelope or housing.

12. A device for analyzing with nuclear magnetic resonance, particularly a spectrometer, characterized in that its measuring heads or probes are supplied by the generating device (1) according to claim 1.

13. A process for the production of radio frequency electrical signals having different frequencies, with a single generating device (1), said signals being modulated or not, characterized in that said process consists in supplying several signals having different frequencies (F) by means of several primary sources (2), in carrying out, as the case may be, a modulation of these different signals, in combining, without intermodulation, said signals (s), if desired combined or mixed, by means of a combining circuit (3), in amplifying the combined signal by means of a wideband power amplifier (4) and if desired with variable gain and, finally, in applying the amplified combined signal to the common input (E) of a multi-channel selection and routing unit (5) with a parallel structure, of which each channel comprises a filter circuit (6) adjusted to be passing for one of the different characteristic frequencies (F) of the primary sources (2), an impedance adaptation circuit (7) and a rejection circuit (8) for frequencies other than the passing frequency of the filter circuit (6) of the selected channel, and, finally, in delivering at the level of each output of each of the different channels of said unit (5), an amplified signal (S) having a frequency (F) characteristic of one of the primary sources (2).

\* \* \* \* \*